US010424462B2

(12) United States Patent
Funk et al.

(10) Patent No.: US 10,424,462 B2
(45) Date of Patent: Sep. 24, 2019

(54) MULTI-CELL RESONATOR MICROWAVE SURFACE-WAVE PLASMA APPARATUS

(71) Applicant: Tokyo Electron Limited, Minato-ku, Tokyo (JP)

(72) Inventors: Merritt Funk, Austin, TX (US); Megan Doppel, Austin, TX (US); John Entralgo, Austin, TX (US); Jianping Zhao, Austin, TX (US); Toshihisa Nozawa, Kanagawa (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/534,870

(22) Filed: Nov. 6, 2014

(65) Prior Publication Data
US 2015/0126046 A1    May 7, 2015

Related U.S. Application Data

(60) Provisional application No. 61/900,684, filed on Nov. 6, 2013.

(51) Int. Cl.
*H01J 37/32* (2006.01)
(52) U.S. Cl.
CPC .. *H01J 37/32266* (2013.01); *H01J 37/32174* (2013.01); *H01J 37/32192* (2013.01); *H01J 37/32229* (2013.01); *H01J 2237/327* (2013.01)
(58) Field of Classification Search
USPC .............................. 118/723 MW; 156/345.41
See application file for complete search history.

(56) References Cited

U.S. PATENT DOCUMENTS 4,776,918 A * 10/1988 Otsubo ................. C23C 16/517
                                              118/50.1
4,866,346 A *  9/1989 Gaudreau ......... H01J 37/32192
                                              118/723 R
5,134,965 A *  8/1992 Tokuda ............. C23C 16/45502
                                              118/715

(Continued)

OTHER PUBLICATIONS

International Search Report and Written Opinion dated Jul. 25, 2014 in PCT/US 14/23724 (15 pages).

(Continued)

*Primary Examiner* — Rakesh K Dhingra
(74) *Attorney, Agent, or Firm* — Rothwell, Figg, Ernst & Manbeck, P.C.

(57) ABSTRACT

A processing system is disclosed, having a multiple power transmission elements with an interior cavity that may be arranged around a plasma processing chamber. Each of the power transmission elements may propagates electromagnetic energy that may be used to generate plasma within the plasma process chamber. The power transmission elements may be designed to accommodate a range of power and frequency ranges that range from 500 W to 3500 W and 0.9 GHz to 9 GHz. In one embodiment, the power transmission elements may include a rectangular interior cavity that enables the generation of a standing wave with two or more modes. In another embodiment, the power transmission elements may have a cylindrical interior cavity that may be placed along the plasma processing chamber or have one end of the cylinder placed against the plasma processing chamber.

21 Claims, 11 Drawing Sheets

(56) References Cited

U.S. PATENT DOCUMENTS

| | | | | |
|---|---|---|---|---|
| 5,188,862 | A | * | 2/1993 | Itatani .................... B23P 5/00 |
| | | | | 117/103 |
| 5,632,921 | A | | 5/1997 | Risman et al. |
| 5,846,612 | A | * | 12/1998 | Takaki .................. C23C 16/505 |
| | | | | 427/569 |
| 5,902,404 | A | * | 5/1999 | Fong .................. H01J 37/32247 |
| | | | | 118/723 ME |
| 6,057,645 | A | * | 5/2000 | Srivastava ........ H01J 37/32284 |
| | | | | 156/345.41 |
| 6,114,811 | A | * | 9/2000 | Wu .................... H01J 37/32192 |
| | | | | 118/723 AN |
| 6,158,383 | A | * | 12/2000 | Watanabe ............. C23C 16/511 |
| | | | | 118/723 AN |
| 7,348,732 | B2 | | 3/2008 | Espiau et al. |
| 7,592,564 | B2 | | 9/2009 | Kumar et al. |
| 8,136,479 | B2 | | 3/2012 | Sugai et al. |
| 8,487,223 | B2 | | 7/2013 | Kimrey, Jr. |
| 2001/0050058 | A1 | * | 12/2001 | Yamamoto ........ H01J 37/32192 |
| | | | | 118/723 MW |
| 2003/0097986 | A1 | * | 5/2003 | Moore ............... H01J 37/32192 |
| | | | | 118/722 |
| 2003/0178143 | A1 | * | 9/2003 | Perrin ............... H01J 37/32192 |
| | | | | 156/345.41 |
| 2004/0011465 | A1 | * | 1/2004 | Matsumoto ......... H01J 37/3222 |
| | | | | 156/345.41 |
| 2004/0069232 | A1 | * | 4/2004 | Huang ............. H01J 37/32229 |
| | | | | 118/723 MW |
| 2005/0160987 | A1 | * | 7/2005 | Kasai .................... H05B 6/705 |
| | | | | 118/723 MW |
| 2009/0045749 | A1 | * | 2/2009 | Ganachev ......... H01J 37/32192 |
| | | | | 315/111.21 |
| 2010/0307684 | A1 | * | 12/2010 | Ota ................... H01J 37/32192 |
| | | | | 156/345.29 |
| 2012/0326803 | A1 | * | 12/2012 | Lee ................... H01J 37/32247 |
| | | | | 333/137 |
| 2013/0192760 | A1 | | 8/2013 | Ikeda et al. |

OTHER PUBLICATIONS

International Search Report and Written Opinion dated Jan. 29, 2015 in PCT/US14/64360 (11 pages).

* cited by examiner

MULTI-CELL RESONATOR MICROWAVE SURFACE-WAVE PLASMA APPARATUS

CROSS REFERENCE TO RELATED APPLICATION

Pursuant to 37 C.F.R. § 1.78(a)(4), this application claims the benefit of and priority to prior filed Provisional Application Ser. No. 61/900,684 filed Nov. 6, 2013 which is expressly incorporated herein by reference.

FIELD OF THE INVENTION

This invention relates to semiconductor processing technology, and more particularly, to apparatus and methods for controlling plasma properties of a processing system for treating a substrate.

BACKGROUND OF THE INVENTION

Typically, uniformly etching substrates using plasma (e.g., ionized gases) generated by microwave or radio frequency power can be difficult to accomplish. Conventional hardware and processing techniques may result in a non-uniform distribution of ions or plasma density across the substrate. The plasma density non-uniformity may result in non-uniform etching or removal of portions of the substrate. Traditional plasma sources may generate non-uniform plasma density across the substrate based on the location of the plasma source relative to the substrate. Generally, plasma sources are located opposite or parallel to the substrate. Unfortunately, plasma sources may not uniformly emit power across their surface to generate a uniform plasma density across the substrate. This may be due to the inability to emit power uniformly at the edge of the plasma source. Increasing the size of the plasma source to improve plasma density uniformity across the substrate may not be practical or possible. Thus, any means that can improve the plasma density near the edge of the substrate would be desirable.

SUMMARY OF THE INVENTION

This disclosure relates to a plasma processing system for controlling plasma density near the edge or perimeter of a substrate that is being processed. The plasma processing system may include a plasma chamber that can receive and process the substrate using plasma for etching the substrate, doping the substrate, or depositing a film on the substrate.

The plasma chamber may include one or more surface wave plasma sources (e.g., power transmission elements) that can emit electromagnetic energy to ionize gas that is delivered into the plasma chamber via a gas delivery system. The power transmission elements may include an interior cavity that can propagate electromagnetic waves that may be provided by a power source. The interior cavity for each of the power transmission element may be electrically isolated from and not in fluid communication with each other, in that each cavity may independently maintain a standing wave. The interior cavities may also include respective openings that permit the propagation of electromagnetic energy into the plasma chamber. The interior cavities and their respective openings may vary in size, such that the openings may form a continuous slit around the plasma chamber or a plurality of non-continuous openings arranged around the plasma chamber. The openings may also be covered by one or more dielectric components that prevent fluid communication between the interior cavities and the plasma chamber.

The dielectric component may be configured to enable the transmission electromagnetic energy or into the plasma chamber. The plasma generated by the electromagnetic energy may be used to treat a substrate on a substrate holder that may be located adjacent or near the power transmission elements. In one embodiment, the electromagnetic energy may be generated by a surface wave or microwave energy source that may be coupled to the interior cavity.

The design of the cavities may vary with respect to geometry and the type of power coupling within the cavity. For example, the interior cavity may be large enough to maintain a standing wave of ½ wavelength of the frequency that may be used to generate plasma in the plasma chamber. In particular, the geometry of the interior cavity may be used to accommodate a of the electric field wavelength and a ½ of the magnetic field wavelength or of the electric field wavelength and of the magnetic field wavelength. In another embodiment, the interior cavity may be circular and/or cylindrical and may include a diameter that may accommodate the electromagnetic fields having ¼ of the electric field wavelength and ½ of the magnetic field wavelength or of the electric field wavelength and ½ of the magnetic field wavelength. In both embodiments, the power coupling between the antenna and the plasma chamber may be magnetically or electrically coupled depending on the orientation of the antenna (not shown) being aligned with the electric field or the magnetic field.

The power coupling may also be influenced by the opening geometry between the interior cavity and the plasma chamber. The opening may be a linear opening with a height between 0.5 mm to 10 mm and a length of at least ¼ wavelength of the electromagnetic energy being used to generate the standing wave within the interior cavity.

In one embodiment, the power transmission element may be oriented, such that the opening is substantially parallel with the substrate with respect to a horizontal plane. However, it is not required that the opening be in the same horizontal plane as the substrate. The opening may be parallel to within +/−20 degrees. In another embodiment, the power transmission element may be oriented, such that the opening is substantially perpendicular to the substrate with respect to a horizontal plane. The opening may be perpendicular within +/−20 degrees.

In one embodiment, the power transmission elements may be coupled to a solid state amplifier (SSA) that may control power, frequency, phase, and modulation of the electromagnetic energy that may be used to form a standing wave within the interior cavity. In certain instances, the SSA's may be controlled to provide different types of electromagnetic energy to their respective chambers. For example, the power and frequency applied to a first power transmission element may be different than the power and frequency applied to a second power transmission element coupled to the same plasma chamber. In certain embodiments, the first and second power transmission elements may also have different interior cavity geometries, depending on the frequency difference of the different signals being applied from the respective SSA.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

Additionally, the left most digit(s) of a reference number identifies the drawing in which the reference number first appears.

DETAILED DESCRIPTION

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Figure 1:
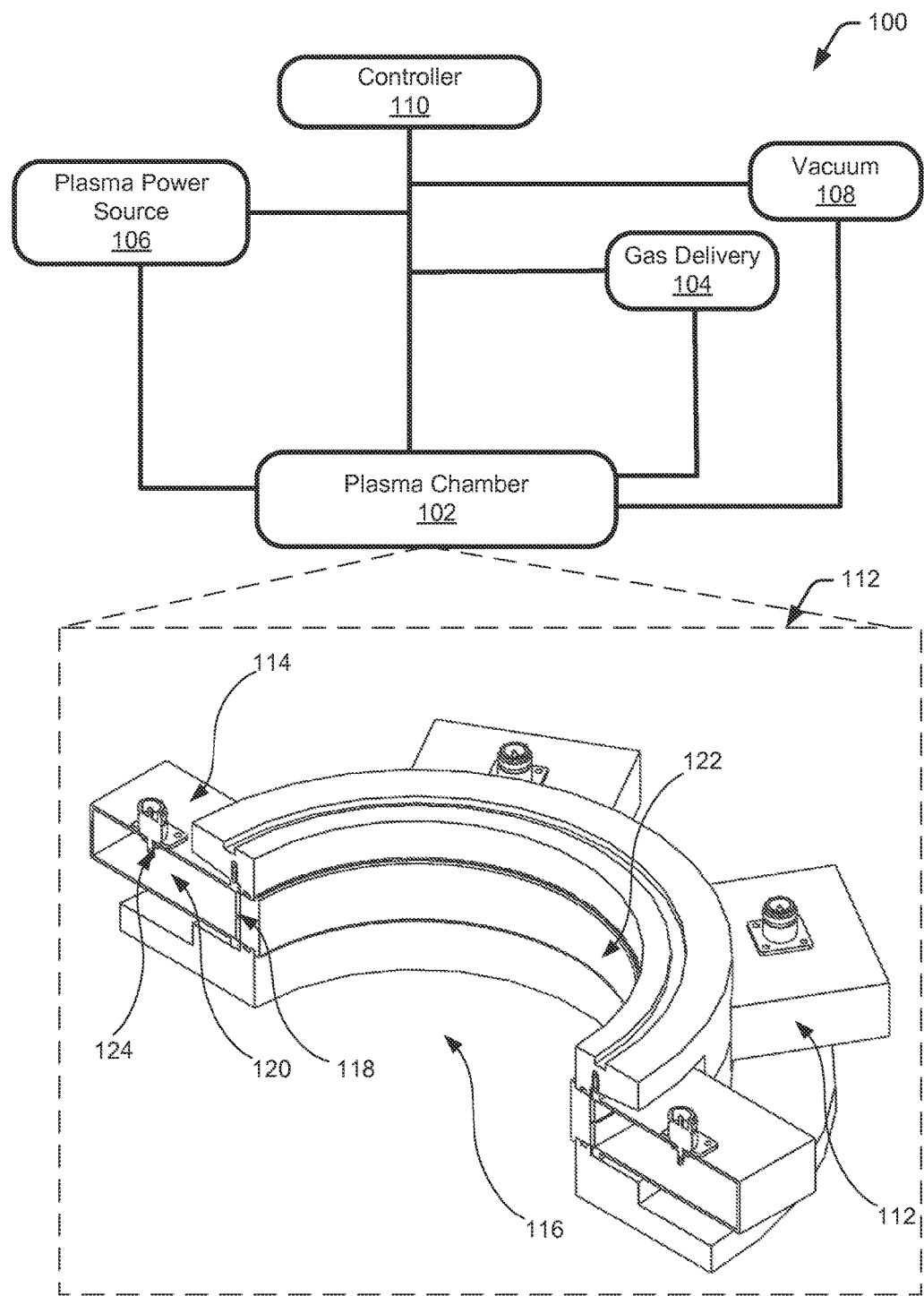
FIG. 1 is an illustration of a representative embodiment of a plasma processing system that shows a schematic cross-sectional illustration of one embodiment of a plasma chamber with a plurality of microwave power transmission elements.

FIG. 1 depicts a plasma processing system 100 for treating substrates using plasma (not shown) that is generated in plasma chamber 102. Plasma may be generated in the plasma chamber 102 by ionizing gas that is provided by a gas delivery system 104 and exposing the gas to electromagnetic energy provided by a microwave power source 106. A vacuum system 108 may also maintain a sub-atmospheric pressure within the plasma chamber 102 during plasma generation. The components of the plasma processing system 100 may be managed or controlled by a controller 110 that may include one or more computer processors (not shown) and memory components (not shown) that may store computer-executable instructions that may be executed by the computer processors or other logic/processing devices. The controller 110 may store recipe or process condition routines that may be implemented by controlling or directing the components of the plasma processing system 100 obtain certain conditions within the plasma chamber 102. Communication between the components may be implemented through processing and electrical communication techniques known to a person of ordinary skill in the art.

The computer processors may include one or more processing cores and are configured to access and execute (at least in part) computer-readable instructions stored in the one or more memories. The one or more computer processors 602 may include, without limitation: a central processing unit (CPU), a digital signal processor (DSP), a reduced instruction set computer (RISC), a complex instruction set computer (CISC), a microprocessor, a microcontroller, a field programmable gate array (FPGA), or any combination thereof. The computer processor may also include a chipset(s) (not shown) for controlling communications between the components of the plasma processing system 100. In certain embodiments, the computer processors may be based on Intel® architecture or ARM® architecture and the processor(s) and chipset may be from a family of Intel® processors and chipsets. The one or more computer processors may also include one or more application-specific integrated circuits (ASICs) or application-specific standard products (ASSPs) for handling specific data processing functions or tasks.

The memory may include one or more computer-readable storage media ("CRSM"). In some embodiments, the one or more memories may include non-transitory media such as random access memory ("RAM"), flash RAM, magnetic media, optical media, solid state media, and so forth. The one or more memories may be volatile (in that information is retained while providing power) or non-volatile (in that information is retained without providing power). Additional embodiments may also be provided as a computer program product including a transitory machine-readable signal (in compressed or uncompressed form). Examples of machine-readable signals include, but are not limited to, signals carried by the Internet or other networks. For example, distribution of software via the Internet may include a transitory machine-readable signal. Additionally, the memory may store an operating system that includes a plurality of computer-executable instructions that may be implemented by the processor to perform a variety of tasks to operate the plasma processing system 100.

Plasma generation may be done by applying electromagnetic energy to an electrically neutral gas to cause negatively charged electrons to be released from a gas molecule that is positively charged as result of the lost electron. Over time, the electromagnetic energy and the increasing electron collisions within the gas increase the density of ionized molecules within the gas, such that the ionized molecules may be influenced by potential differences within the plasma chamber 102. For example, the potential differences within the plasma chamber 102 may direct the ionize molecule towards a substrate (not shown). The ionized molecules (not shown) may interact with the substrate or treat the substrate in a way that may remove a portion of the substrate or may be deposited unto the substrate. In this way, patterns may be etched into the substrate or films may be deposited onto the substrate.

Plasma density across the plasma chamber 102 may impact the uniformity of the plasma treatment of the substrate. The plasma density may be a measure of ion density within a volume of the plasma within the plasma chamber 102. Plasma processing uniformity may be impacted when the plasma density varies across the substrate such that higher plasma density at the center of the substrate may cause a higher etch rate than the etch rate at the edge of the substrate. Generally, this process non-uniformity may be the result of the placement of a power transmission element near the center of a circular substrate and/or by diffusion characteristics of the plasma. One approach to resolve the non-uniformity may be to locate power transmission elements near the edge or around the substrate. A detailed cross-section view 112 illustrates one embodiment of this approach for the plasma chamber 102.

In FIG. 1, a multi-cavity embodiment of the plasma chamber 102 may be configured with two or more power transmission elements 114 that may be used to transmit electromagnetic energy into the plasma processing area 116 where the substrate (not shown) may be placed for treatment. The detailed view is a cross section illustration of the entire plasma chamber, The power transmission elements 114 may not be in fluid communication with each other and/or the plasma processing area 116. Although the power transmission elements 114 may have an opening 118 between the interior cavity 120 and the plasma processing area, a dielectric component 122 may be arranged into or onto the opening 118 to prevent fluid communication between the plasma processing area 116 and the interior cavity 120. In the FIG. 1 embodiment, the dielectric component 122 may cover the openings 118 for two or more of the power transmission elements 114. The dielectric component 122 may be made of, but is not limited to, quartz and ceramic materials.

The power transmission elements 114 may be arranged around the plasma processing area either above, below, or at in the same horizontal plane (not shown) of a surface of the substrate. The power transmission elements 114 may be arranged to maximize the amount of openings 118 around the substrate or may be minimize the amount of openings 118 around the substrate. The minimization and maximization may be dependent upon the circumference of the plasma chamber and the length of the openings 118.

The geometry of the interior cavity 120 may vary depending on the power and frequency being provided from the antenna 124 that may be in electrical communication with the power source 106. Broadly, the frequency may range from 0.9 GHz to 12 Ghz and the power may vary between 50 W to 3500 W, but the geometry of the power transmission element 114 may vary depending the desired process conditions. As a guideline, but is not required, the power transmission element 114 may be large enough to maintain a standing wave of ½ wavelength of the frequency that may be used to generate plasma in the plasma processing area 116. In particular, the geometry of the power transmission element 114 may be used to accommodate ¼ of the electric field wavelength and ½ of the magnetic field wavelength or ½ of the electric field wavelength and ½ of the magnetic field wavelength. In a preferred embodiment, the standing wave may be ½ a wavelength with two modes, but in other embodiments, the standing wave may include multiple wavelengths as the frequency increases without changing the geometry of the power transmission element 114. For example, in a 1 GHz signal embodiment, the interior cavity 120 may have a length of 150 mm (½ wavelength) and a width of 75 mm (¼ wavelength). In a 9 GHz embodiment, the interior cavity 120 with length may be about 8 mm and the width may be about 16 mm. The geometry of the opening 118 may be considered when designing the power transmission element 114.

Broadly, the length (i.e. horizontal) of the opening 118 may be at least greater than or equal to wavelength (e.g., 75 mm@ 1 GHz) of the incoming electromagnetic energy and the height (i.e. vertical) may vary between 0.5 mm to 10 mm. The opening 118 side of the interior cavity 120 may be formed to conform to the circular structure that forms the plasma chamber 102. Hence, the opening 118 may be semi-circular in nature as to provide a seamless integration of the power transmission element 114 with the sidewall of the plasma chamber 102. For example, the radius of curvature of the interior chamber wall may be similar to the radius of curvature of the side wall of the of the power transmission element 114 that includes the opening 118.

In another embodiment, the interior cavity 120 may be circular and/or cylindrical and may include a diameter that may accommodate, but is not limited to, the electromagnetic fields having (i) ¼ of the electric field wavelength and ½ of the magnetic field wavelength or (ii) ½ of the electric field wavelength and ½ of the magnetic field wavelength. In all of the embodiments, the power coupling between the antenna and the plasma chamber 102 may be magnetically or electrically coupled, which may be determined by the orientation of the antenna. For example, when the antenna is aligned with the direction of the electric field, this may be considered an electric coupling configuration. However, when the antenna 124 is aligned with the magnetic field, this may be considered a magnetic coupling configuration. In the FIG. 1 embodiment, may be considered an electric field coupling based on the orientation of the antenna 124 being aligned with the electric field oscillates up and down along the antenna and between the top and bottom sides of the interior cavity 120.

In one embodiment, the circular interior cavity (not shown) may include an opening at one of the opposing ends of the cylinder, such that the end of the cylinder is connected to or interfaced with the sidewall of the plasma chamber 102. In an alternative embodiment, the cylinder may instead have an opening along the side of cylindrical cavity which may be conformal with the sidewall wall of the plasma chamber 102. In this instance, the cylindrical may have a radius of curvature along it length that may be similar to the radius of curvature of the plasma chamber 102.

Figure 2:
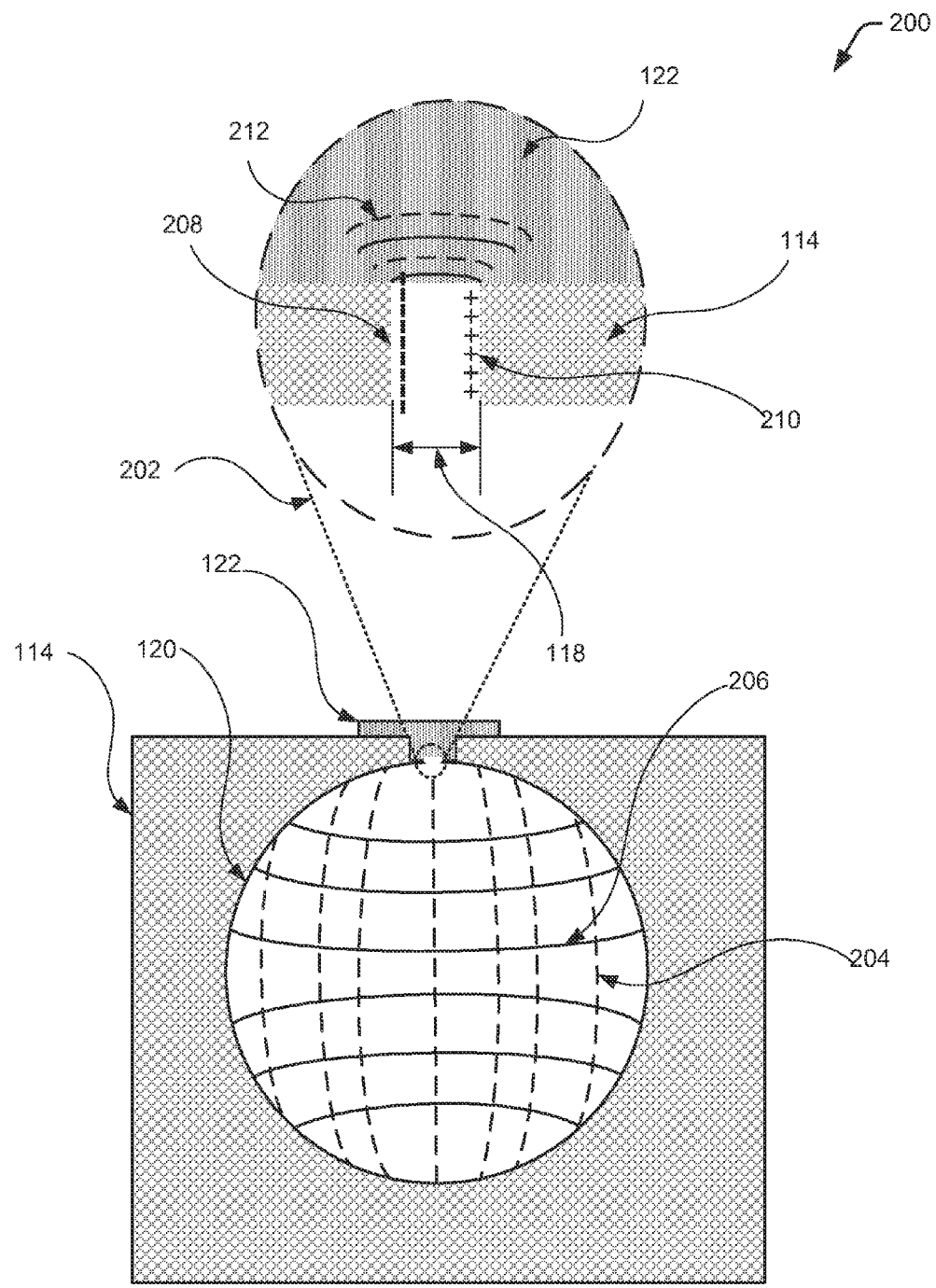
FIG. 2 is an illustration of a cross section of an exemplary interior cavity and continuous slit of a power transmission element and a representation of the electromagnetic energy transmitted through the interior cavity and emitted into the plasma chamber.

The power source 106 may include, but is not limited to, a magnetron capable of generating electromagnetic energy in the radio frequency (RF) or microwave spectrum. The microwave spectrum may include electromagnetic waves with wavelengths ranging between 1 mm and 1 m and a frequency ranging between 300 MHz and 300 GHz. The RF spectrum may include electromagnetic waves with wavelengths ranging between 1 mm and 1 m and a frequency ranging between 300 kHz and 300 GHz. As shown in FIG. 2, the electromagnetic energy may be propagated through the dielectric component 122 to generate an alternating potential across the opening 118 that may generate an electric field (not shown) that is emitted into the plasma chamber 102.

FIG. 2 is a cross-sectional illustration 200 of an exemplary dielectric component 122 and antenna 124 of a power transmission element 114. The illustration 200 also depicts a representation of the electromagnetic energy transmitted through the interior cavity 120 and emitted from the opening 118 through the dielectric component 122. The exploded view 202 of the opening 118 and dielectric component 122 is intended to explain the transmission of electromagnetic energy from the power transmission element 114 into the plasma chamber 102 enclosure.

The illustration 200 is intended to represent a static two-dimensional representation of electromagnetic energy comprising a magnetic field 204 and an electric field 206 in a transverse oscillating wave (not shown) propagating through the interior cavity 120 (e.g., propagating out of the FIG. 2 page). The dashed substantially horizontal magnetic field lines 204 represent the oscillation of the magnetic field as it propagates through the interior cavity 120. The solid substantially vertical electric field lines 206 represent the oscillation of the electric field as it propagates through the dielectric component 122.

The electromagnetic wave propagation through the interior cavity 120 may induce a potential difference across the opening 118. For purposes of explanation, a negative charged surface 208 may be formed on the upper portion of the opening 118 and a positively charged surface 210 on the lower portion of the opening 118. However, the potential difference across the opening 118 may also oscillate as the surface charge changes in concert with the change in current flow. The potential difference may generate an electromagnetic field 212 that may propagate through the dielectric component 122 and into the plasma chamber 102. The energy from the electromagnetic field 212 may separate electrons from their respective gas molecules and form ionized molecules (e.g., plasma) that may be used to treat the substrate.

In the FIG. 2 embodiment, the interior cavity 120 cross-sections are shown as circular. However, in other embodiments the cross section geometry of the interior cavity can vary in structure and size. For example, the interior cavity 120 cross section may be square or rectangular. Regardless of cross section geometry, the principles of electromagnetic propagation may still apply, but the geometry may impact the characteristics or power peak of the electromagnetic wave propagating in the interior cavity 120 and the electromagnetic field 212 transmitted into the plasma chamber 102. A rectangular embodiment will now be described in the description of FIG. 3.

Figure 3:
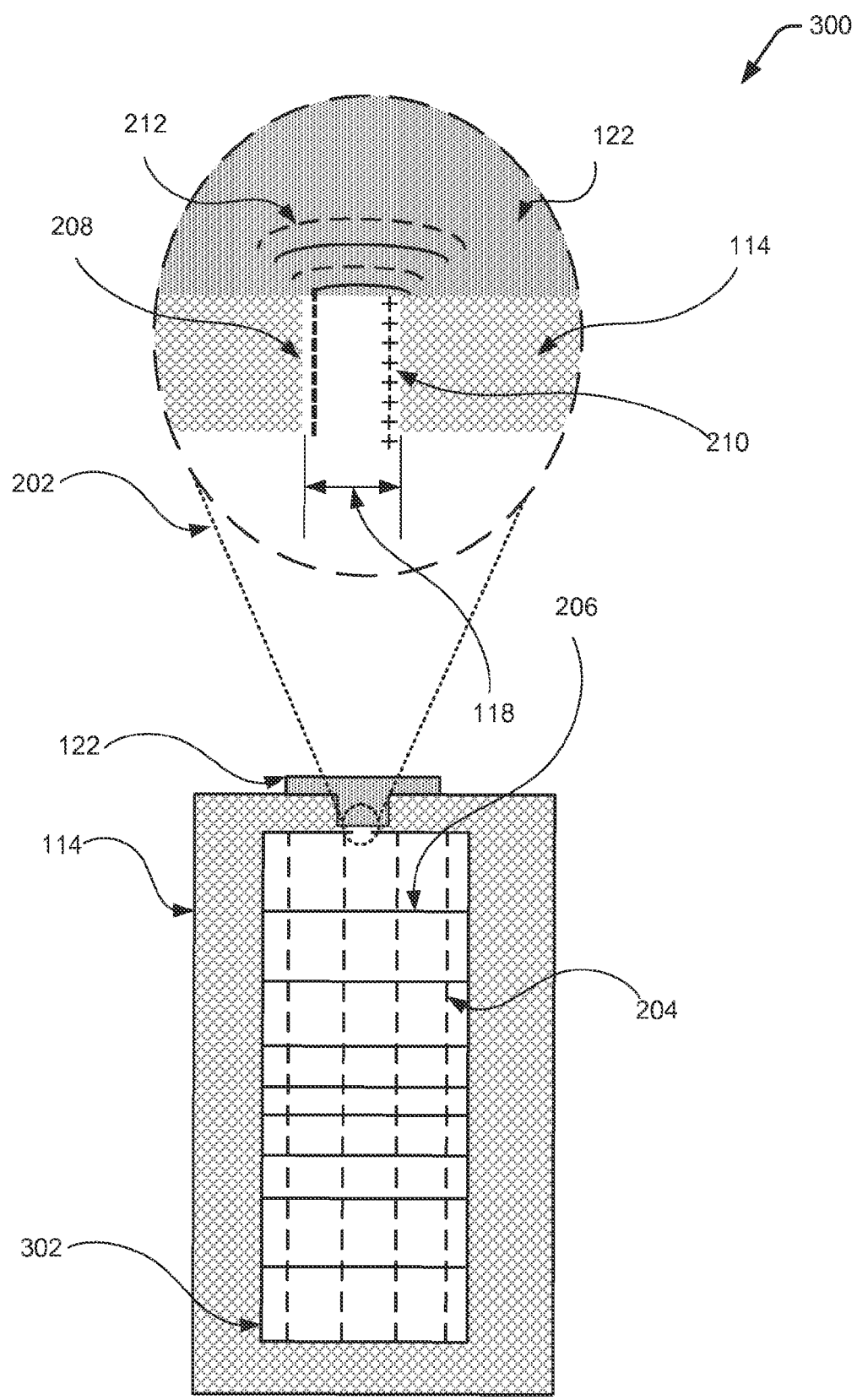
FIG. 3 is another illustration of a cross section of another exemplary interior cavity and continuous slit of a power transmission element and a representation of the electromagnetic energy transmitted through the interior cavity and emitted into the plasma chamber.

FIG. 3 is a cross-sectional illustration 300 of a rectangular interior cavity 302 and opening 118 of a power transmission element 114 along with a representation of the electromagnetic energy transmitted through the interior cavity 302 and emitted from the continuous slit 124. Again, the power source 106 may be coupled to the interior cavity 302 and propagate electromagnetic energy as represented by the magnetic field lines 204 and the electric field lines 206. Consequently, the oscillating potential difference across the opening 118 may generate an electromagnetic field 212 that may be transmitted through the dielectric component 126 and into the plasma chamber 102 enclosure. The exploded view 304 of the opening 118 and dielectric component 122 is intended to explain the transmission of electromagnetic energy 212 from the power transmission element 114 into the plasma chamber 102 enclosure.

FIG. 3 is intended to show that the electromagnetic wave propagation is not limited to a specific geometry for the interior cavity 120. The geometry may be circular (as shown in FIG. 2), rectangular, square, or any other geometric shape that may include a one or more openings 118 that provide an opening between the interior cavity 302 and the plasma chamber 102 enclosure. In this way, the power transmission element 114 may enable a distribution of electromagnetic energy throughout the plasma chamber 102. The circular power transmission element 112 is merely one energy distribution embodiment.

One aspect of the power transmission element 114 that may also influence plasma density uniformity is the distribution of electromagnetic energy that may be received into the interior cavity 120. Generally, the more uniform the distribution of the electromagnetic energy may increase the uniformity of the plasma within the plasma processing region. However, the electromagnetic energy may be received into the interior cavity 120 at one or more distinct points, which may result in higher plasma densities proximate to, adjacent to, or opposite those distinct points. One embodiment of this approach may be to include one or more antennas 124 into each of the interior cavities 120.

Figure 4A:
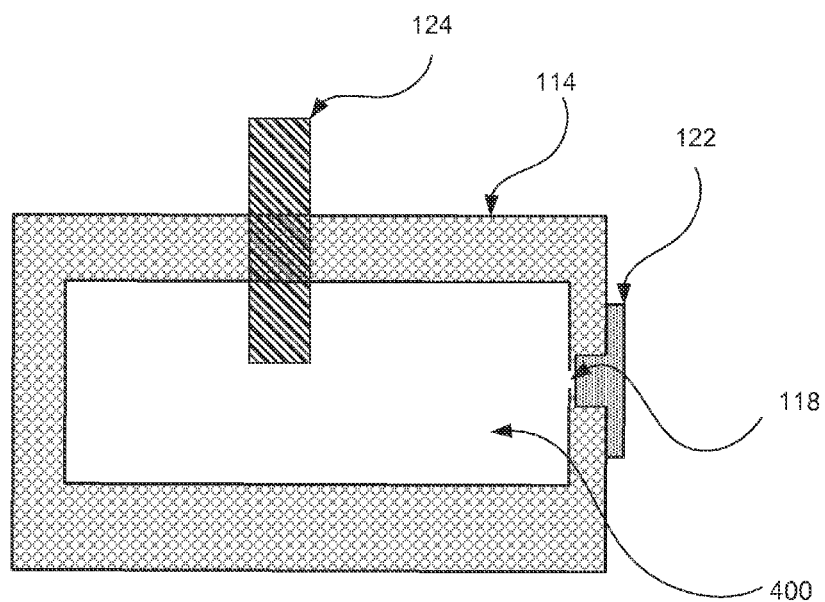
FIGS. 4A-4D are an illustration of a cross section of exemplary interior cavities that a magnetic field coupling and an electric field coupling for a standing wave the cavities.

FIGS. 4A-4D are illustrations of cross-section of exemplary interior cavities that a magnetic field coupling (H-coupling) and an electric field coupling (E-coupling) for a standing wave the cavities. Specifically, FIG. 4A is an illustration of an E-coupling embodiment in a rectangular interior cavity 400 that may include an antenna 124 disposed in parallel with the direction of the electric field 206 and perpendicular to the magnetic field 204. The antenna 124 is not required to be absolutely parallel or perpendicular to the fields, but may protrude into the rectangular interior cavity 400 such that the electric field may oscillate towards and away from the antenna as the electromagnetic energy propagates within the rectangular interior cavity 400. In one specific embodiment, the antenna 124 may extend about ¼ wavelength into the rectangular interior cavity 400 and may be disposed about ¼ wavelength from the opening 118. However, the antenna 124 position is not limited to this previous specific embodiment. The size and/or design of the antenna 124 may vary depending on the frequency of the electromagnetic energy provided to the power transmission element 114.

Figure 4B:
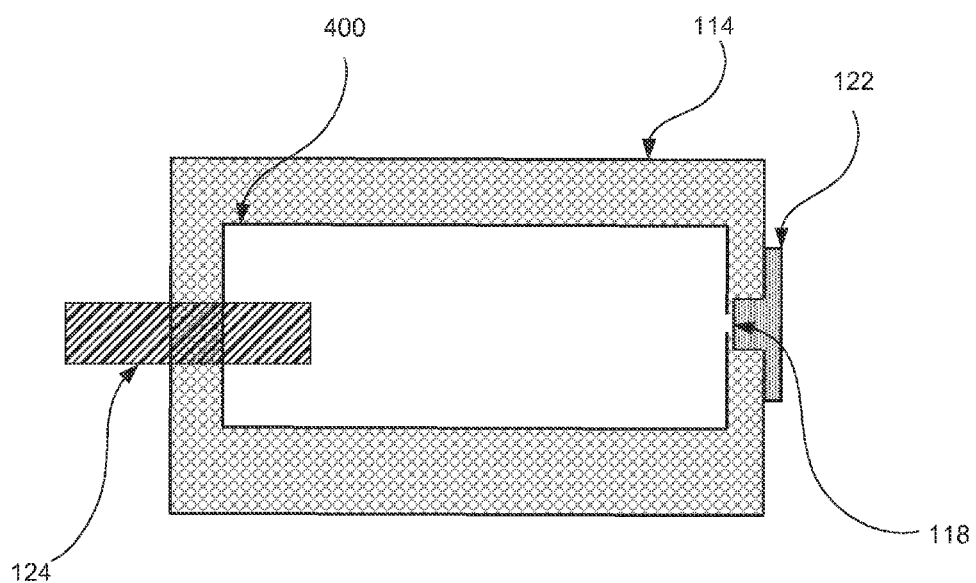

FIG. 4B is an illustration of a H-coupling embodiment in the rectangular interior cavity 400 that may include an antenna 124 disposed in parallel with the direction of the magnetic field 204 and perpendicular to the electric field 206. The antenna 124 is not required to be absolutely parallel or perpendicular to the fields, but may protrude into the rectangular interior cavity 400 along a sidewall that may oscillate towards and away from as the electromagnetic energy propagates within the rectangular interior cavity 400. In one specific embodiment, the antenna 124 may extend about ¼ wavelength into the interior chamber 120 and may be disposed on the sidewall that may be opposite the opening 118. However, the antenna 124 position is not limited to this previous specific embodiment. The size and/or design of the antenna 124 may vary depending on the frequency of the electromagnetic energy provided to the power transmission element 114.

Figure 4C:
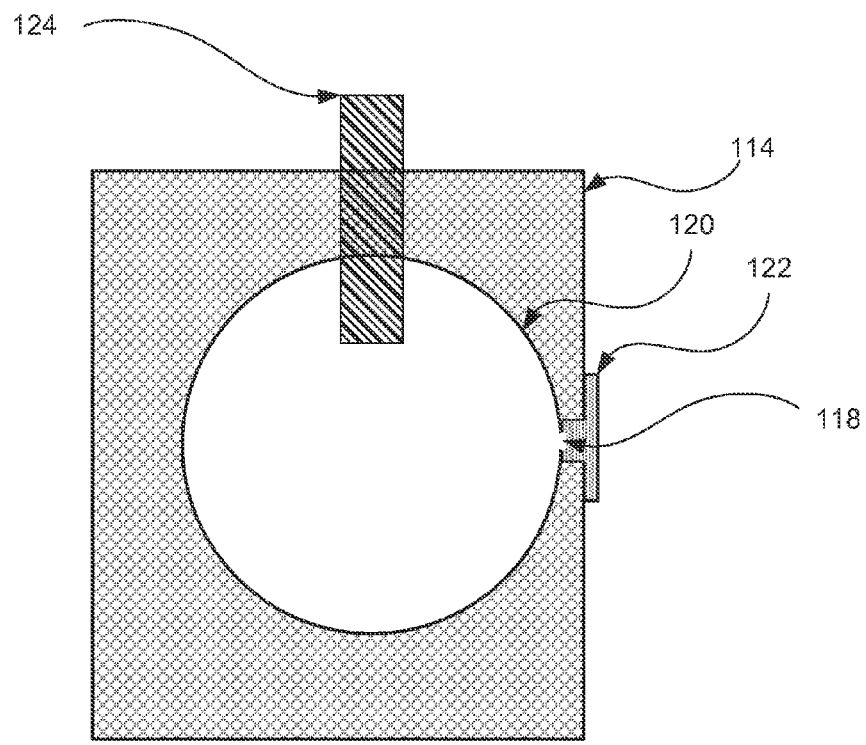

FIG. 4C is an illustration of an E-coupling embodiment in a cylindrical interior cavity 402 that may include an antenna 124 disposed in the same or similar plane as the oscillating electric field 206 which is approximately perpendicular with the magnetic field 204. The antenna 124 is not required to be absolutely parallel or perpendicular to the fields, but may protrude into the cylindrical interior cavity 120 along a sidewall that may oscillate towards and away from as the electromagnetic energy propagates within the rectangular interior cavity 400. In one specific embodiment, the antenna 124 may extend about ¼ wavelength into the cylindrical interior cavity 120 and may be disposed about ¼ wavelength from the opening 118. However, the antenna 124 position is not limited to this previous specific embodiment. The size and/or design of the antenna 124 may vary depending on the frequency of the electromagnetic energy provided to the power transmission element 114.

Figure 4D:
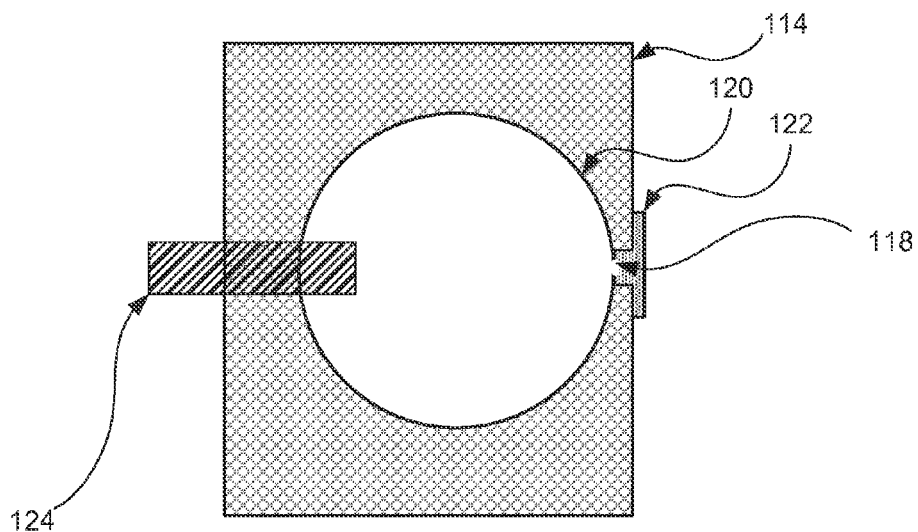

FIG. 4D is an illustration of a H-coupling embodiment in the cylindrical interior cavity 402 that may include an antenna 124 disposed in the same or similar plane as the oscillating magnetic field 204 which is approximately perpendicular with the electric field 204. The antenna 124 is not required to absolutely parallel or perpendicular to the fields, but may protrude into the cylindrical interior cavity 402. In one specific embodiment, the antenna 124 may extend about ¼ wavelength into the interior cavity 120 and may be disposed on the sidewall that may be opposite the opening 118. Hence, the size and/or design of the antenna 124 may vary depending on the frequency of the electromagnetic energy provided to the power transmission element 114.

Within the cylindrical cavity 402 embodiments, the cylindrical cavity 402 may have an opening length (not shown) that may vary from as small as ¼ wavelength up to at least half of the radius of the plasma chamber 102. For example, the cylindrical cavity 402 may wrap around half of the plasma chamber and the electromagnetic wave may propagate along the cylinder and form a standing wave. The opening (not shown) length may extend around the plasma chamber 102 in a similar length as the cylinder. The height of the opening may vary between 0.5 mm and 10 mm. As noted above, the diameter of the cylinder may vary based on the wavelength of the electromagnet energy provide to the cylindrical cavity 402. In one instance, the diameter may be have a diameter of about ½ wavelength provided by the plasma source 106.

In another embodiment, the interior cavities 120 described above may also be changed by inserting a quartz or ceramic component into the interior cavity 120. The material may enable a smaller space for generating a standing wave within the power transmission element 114. In one embodiment, the entire interior cavity 120 may be filled with quartz or ceramic, however the power transmission may be lower than an interior cavity 120 filled with a gas. In an alternative embodiment, a portion (e.g., ¼) of the interior cavity may be filled with a quartz or ceramic material, which may enable a smaller interior cavity 120, but with a lower loss of power than the completely filled interior cavity 120 embodiment. In one specific embodiment, a wavelength embodiment in a gas-filled cavity may have a 30 mm length configuration, but may be converted to a 15 mm length by using a quartz-filled cavity or a 9.7 mm length by using a ceramic-filled cavity in lieu of a gas-filled cavity.

Figure 5:
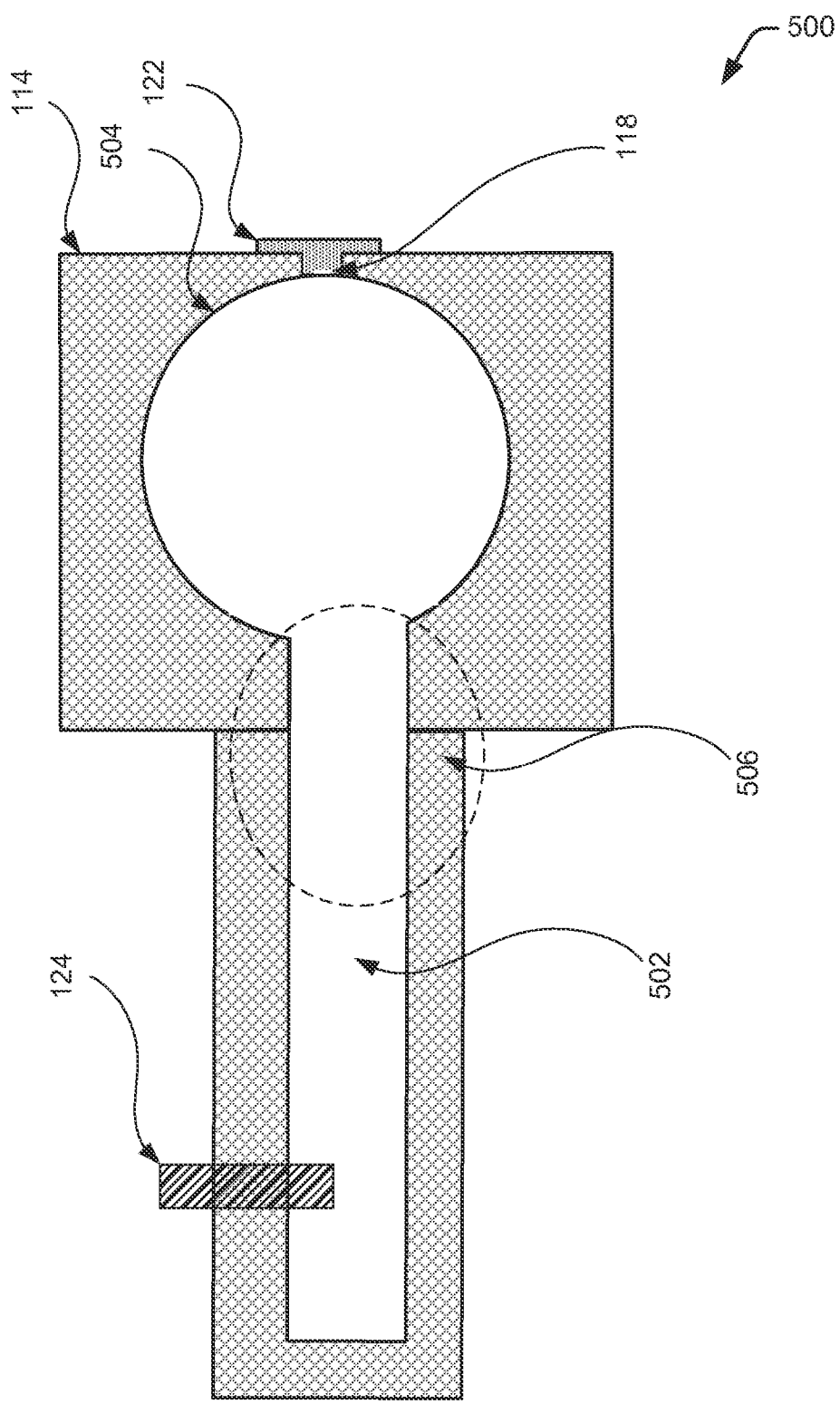
FIG. 5 is an illustration of another cross section of an exemplary interior cavity and a power coupling that provides electromagnetic energy to generate a standing wave in the cavity.

FIG. 5 is an illustration of another cross section of a combination cavity 500 that incorporates a rectangular cavity 502 and a cylindrical cavity 504, in which the rectangular cavity 502 may act as tuning mechanism for the electromagnetic energy provided to the cylindrical cavity 402. The tuning mechanism may include one or more tuning stubs that may extend into the rectangular cavity 400 at various lengths depending what on power transmission efficiency may be desired. Ideally, the tuning mechanism may be adjusted to enable peak power performance given the impedance, frequency, and power provided by the plasma source 106. The one or more tuning stubs may include any transmission line material, such as a stripline or coaxial cable, and may be of a suitable length and reactance depending on the desired process conditions.

Another tuning embodiment may include adding an aperture to the transition region 506 between the rectangular interior cavity 400 and the cylindrical interior cavity 402. The aperture may include any opening of any configuration that is between 0.5 mm and 10 mm high and may be up to wavelength in length. In this way, the electromagnetic wave may propagate from the rectangular interior cavity 502 through a transition region 506 and into the cylindrical cavity 504 and emit power into the plasma chamber 102 via the opening 118 and dielectric component 122. The transition region 506 may include one or more components that may condition or tune the electromagnetic wave to match the impedance between cavities and the plasma chamber 102.

Figure 6:
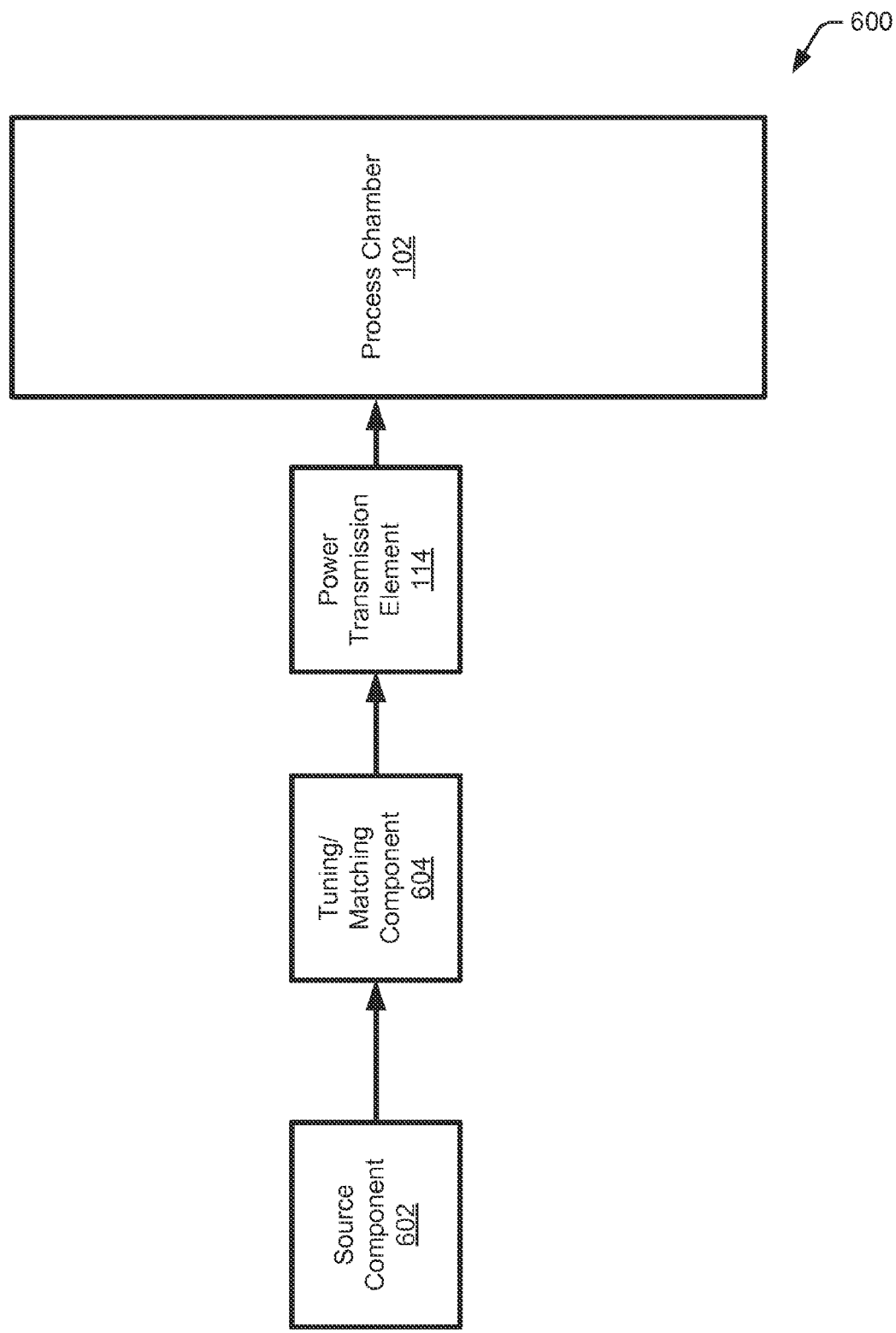
FIG. 6 includes a schematic illustration of a path for electromagnetic energy that may be delivered to the plasma chamber.

FIG. 6 includes a schematic illustration of a path 600 for electromagnetic energy that may be delivered to the plasma chamber 102. Broadly, the source component 602 may generate the electromagnetic energy at a desired power and frequency to generate plasma within the plasma chamber 102. Although a single path 600 is illustrated, the plasma chamber 102 may be connected to several power transmission elements 114 that may include the same components and similar signals that are sent down each path. However, in certain instances, the paths 600 may have varying conditions for the electromagnetic energy, see FIG. 7.

The electromagnetic energy along the path 600 may be conditioned or tuned using a tuning/matching component 604 to optimize the frequency and/or power to optimize the energy transmission from the source component 602 into the power transmission element 114 and the plasma chamber 102. In one embodiment, the tuning/matching component 604 may be coupled series to the power transmission element 114 as a separate component, such as a solid state amplifier (SSA) that may control the phase, power, frequency, and modulation of the electromagnetic energy to the power transmission element 114. For example, the SSA may alter the frequency to match the impedance of the components along the electromagnetic energy path to enable efficient power transmission into the plasma chamber 102. The controller 110 may have a target set point of 2.5 GHz for the plasma process. However, in one embodiment, the controller 110 may direct the SSA to shift the frequency off target to 2.46 GHz to optimize the power being transmitted through the power transmission element 114 into the plasma chamber 102. The peak power of the electromagnetic energy may not be at the target set point of 2.5 GHz due to the configuration of the transmission line between the source component 602 and the plasma chamber 102. For example, the geometry power transmission element 114, the plasma chamber 102, and the type of gases that may be used in the plasma chamber 102 may alter the impedance of the transmission path or the frequency at which peak power is transmitted into the plasma chamber 102.

In one embodiment, the source component 602 may be a magnetron that may generate electromagnetic energy, particularly in the microwave spectrum (e.g., 300 MHz and 300 GHz). The magnetron may be similar to the magnetrons manufactured by Nihon Kashouha™ in Yokohama, Japan.

In one embodiment, the tuning/matching component 604 may include a solid state amplifier (SSA) that may control the power, frequency, phase, and modulation of the incoming electromagnetic energy to the power transmission element 114. The SSA may be similar to pulsed power components (e.g., GaN transistors) manufactured by Microsemi™ in San Jose Calif. In another embodiment, the tuning/matching component 604 may include tuning stubs in the interior cavity 120 of the power transmission element 114. For example, the stub tuners may be similar to the tuning stubs manufactured by Gerling Applied Engineering™ in Modesto, Calif.

Figure 7:
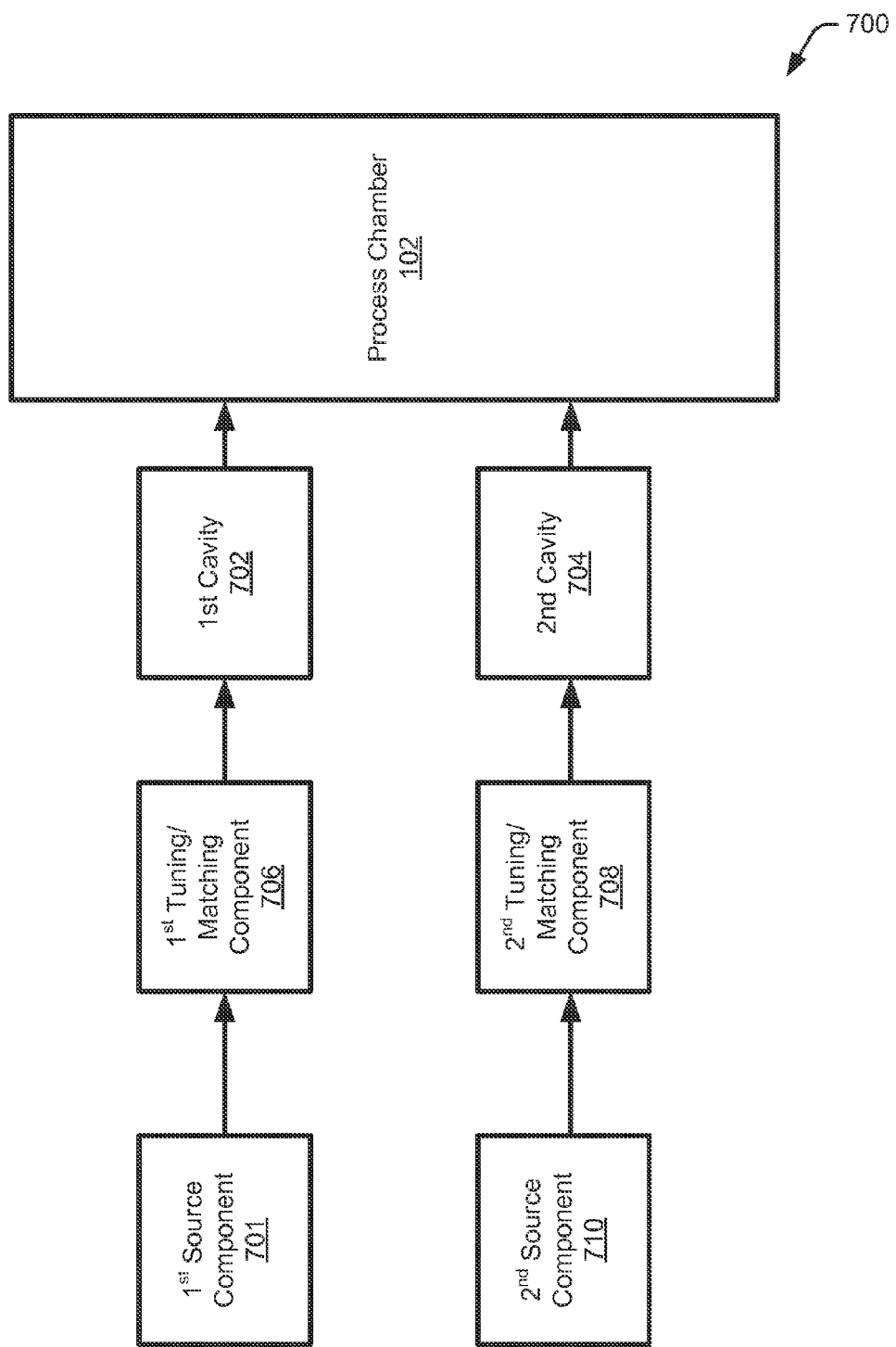
FIG. 7 includes a schematic illustration of paths for electromagnetic energy that may be delivered to the plasma chamber.

In another embodiment, multiple power transmission elements 114, as shown in FIG. 7, may be powered separately, in that each power transmission element 114 may receive electromagnetic energy at different power, frequency, phase, and/or modulation conditions to generate plasma in the plasma chamber 102.

FIG. 7 includes a schematic illustration of paths 700 for electromagnetic energy that may be delivered to the plasma chamber 102 using multiple power transmission elements 114. Although the multi-path 700 embodiment may include similar components as described in the single path 600 embodiment, the paths may have different characteristics for the electromagnetic energy. The first path may include a first electromagnetic wave source component 701 and a first tuning/matching component 706 that may be similar to the source component 602. The first tuning/matching component 706 may adjust the frequency, power, phase, and/or modulation of the electromagnetic wave provided by the first source component 702.

In certain embodiments, the type of differences may be slight variations that may not require significant changes to the power transmission elements 114. However, in other instances, the signal differences between the paths may dictate changes to the path 700 components, particularly the power transmission elements 114.

For example, the geometry of the power transmission elements may be dependent on the frequency of the electromagnetic energy. The ½ or ¼ wavelength design guidelines for the power transmission elements 114 may not dictate geometry differences for frequencies 2.4 GHz and 2.6 GHz or higher. For example, different interior cavity 120 designs may be needed when the first path has a frequency of 2.5 GHz and the second path has a frequency of greater than 3 GHz (e.g., 5 Ghz). In this instance, the first and second path may share the same power source 701 or have separate power sources (e.g., $2^{nd}$ power source 710), but may have separate tuning/matching components (e.g., tuning matching component 706, tuning/matching component 708). In certain instances, the difference between the incoming signals to the plasma chamber 102 may be large enough to dictate different geometries for the first power transmission cavity 702 and the second power transmission cavity 704.

In one specific embodiment, the first cavity 702 may be designed to generate a standing wave with two modes using an incoming signal with a frequency less than 3 GHz. In this instance, the first frequency may be 2.5 GHz, which using the design guidelines described above, the length of the first cavity 702 may be a ½ wavelength (e.g., ~60 mm) and a ¼ wavelength in height (e.g., ~30 mm). In contrast, the second cavity 704 may be designed to generate a standing wave with two modes using an incoming signal with a frequency greater than 3 GHz. For example, if the second frequency may be 5 GHz which may result in the length of the second transmission component 704 may be a wavelength (e.g., ~30 mm) and a ¼ wavelength in height (e.g., ~15 mm). In the 5 GHz embodiment, a second source component 710 may be used to generate the higher frequency signal separately from the 2.5 GHz signal generated by the first source component 701.

Although the power transmission elements 114 may receive disparate frequency signals, the power transmission elements 114 may have the same or similar geometry, but the higher frequency signals may induce a higher number of modes within power transmission elements 114 that have the same or similar geometry. Hence, the first cavity 702 may have a two mode standing wave using a first frequency and the second cavity 704, which may have a similar geometry as the first cavity 702, may have a standing wave with two or more modes due to using a second frequency that may be higher than the first frequency. The frequency and the number of modes within the second cavity 704 may be optimized to achieve a desired plasma density and/or uniformity within the plasma chamber 102.

Figure 8:
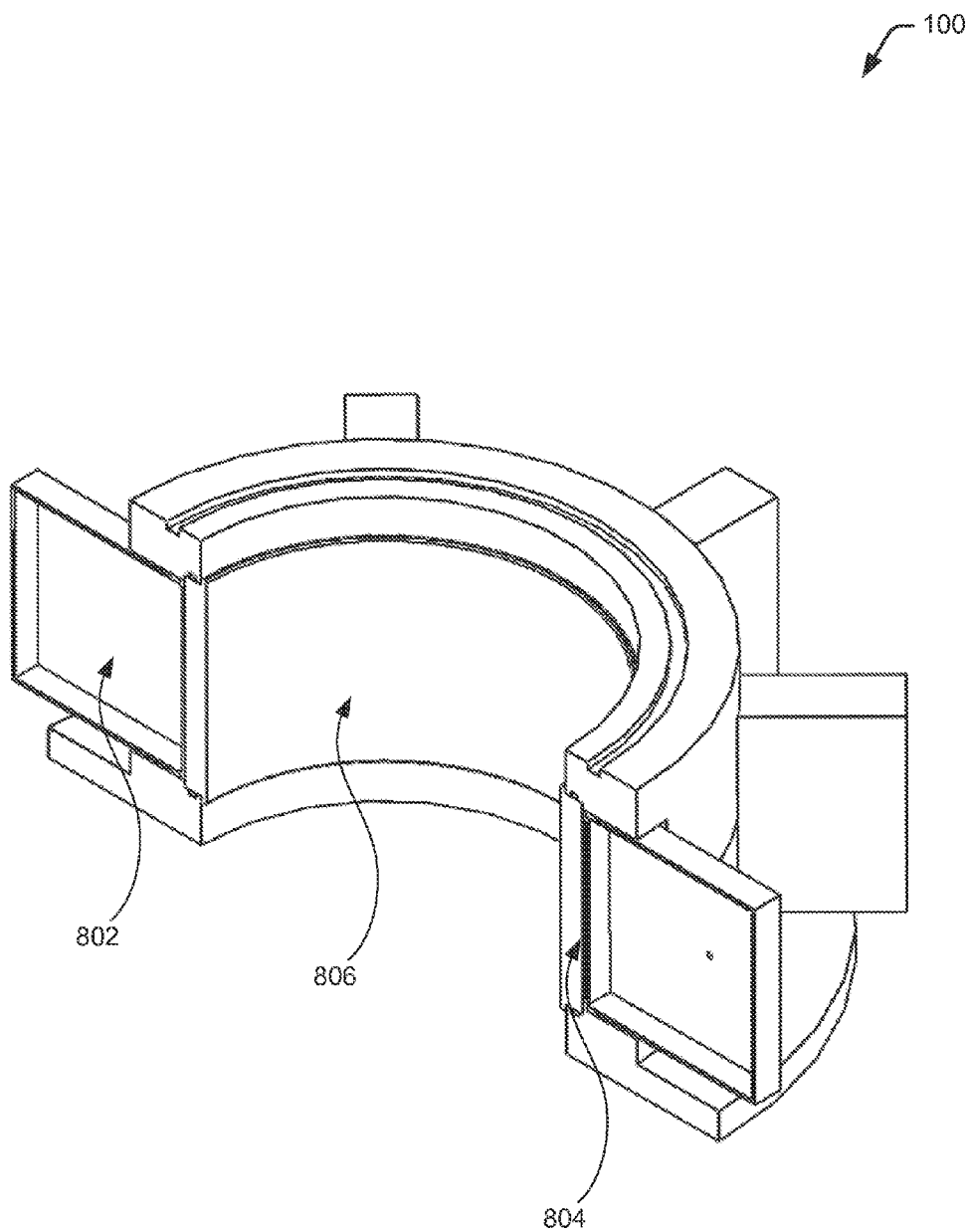
FIG. 8 is a schematic cross-sectional illustration of one embodiment of a plasma chamber with a plurality of microwave power transmission elements arranged vertically around the plasma chamber.

FIG. 8 is a schematic cross-sectional illustration of one embodiment of a plasma chamber 800 with a plurality of vertical power transmission elements 802 arranged vertically around the plasma chamber 800. In the previous embodiments, the power transmission elements 802 have been arranged in a horizontal manner and distribute a majority of the energy along a plane that is parallel to the substrate (not shown) disposed within the plasma chamber 102. In contrast, the FIG. 8 embodiment directs the energy into the plasma chamber 800 from openings 804 that are disposed in a perpendicular manner relative to the substrate disposed within the plasma chamber 800. The vertical dielectric component 806 may again cover the openings 804, in a similar manner as the dielectric component 122 in the horizontal embodiments, such as preventing fluid communication between the processing area adjacent to the substrate and the cavities of the vertical power transmission elements 802. In most instances, the vertical power transmission elements 802 may operate and be designed in a similar manner as the horizontal power transmission elements 114. However, accommodations may be made to position the vertical power transmission elements 802 in a vertical manner that may form an angle between 60 degrees and 120 degrees from a horizontal plane that may include the substrate. In the FIG. 8 embodiment, the angle between the openings and the horizontal plane that includes the substrate is about 90 degrees.

Figure 9:
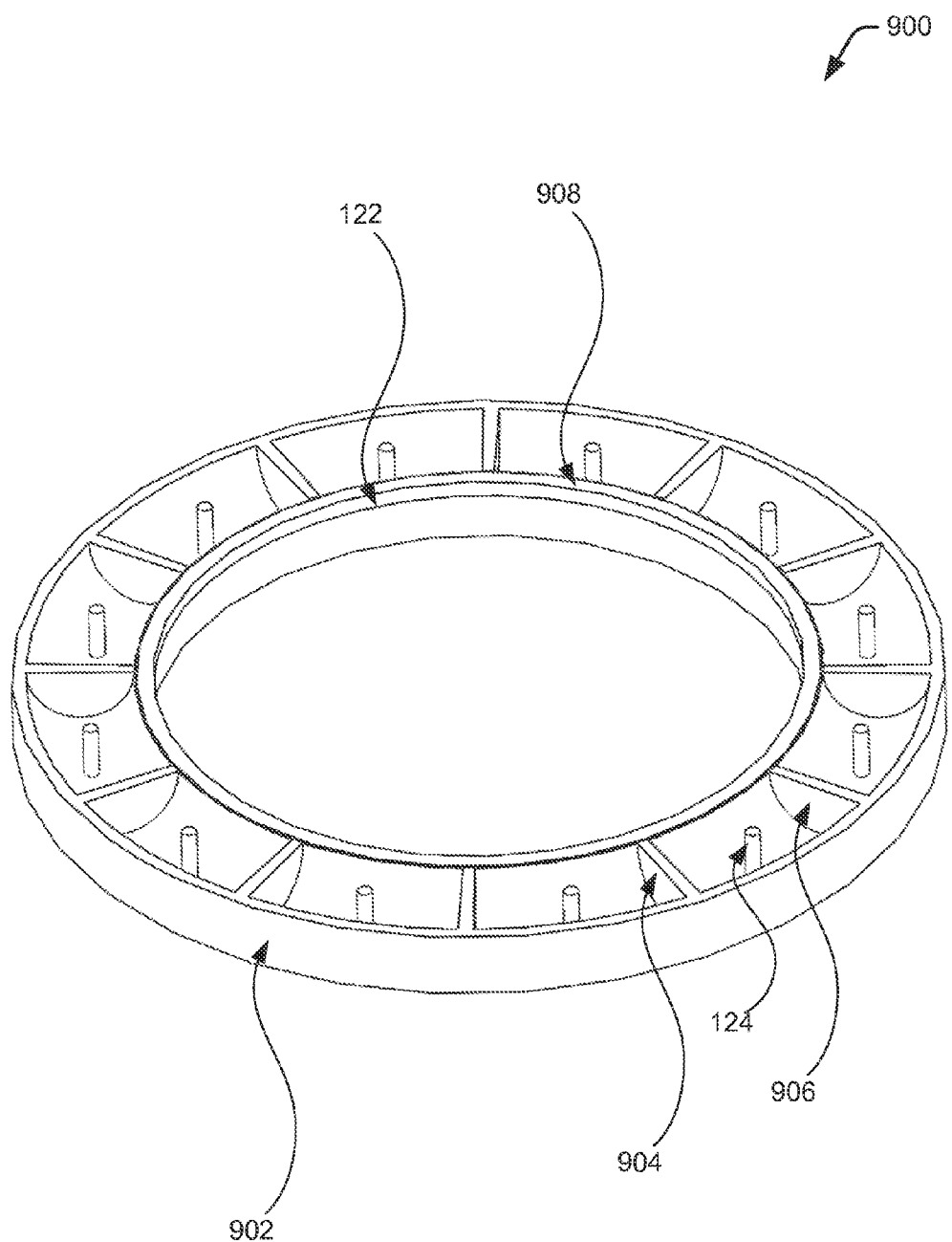
FIG. 9 a schematic cross-sectional illustration of one embodiment of a plasma chamber with a plurality of microwave power transmission elements.

FIG. 9 a schematic cross-sectional illustration of one embodiment of a plasma chamber 900 with a plurality of power transmission elements 902 that may share a cavity wall with adjacent power transmission elements 902. The plasma chamber 900 is intended to be used for illustrative purposes, in that the power transmission elements 902 may be disposed close enough together, such that adjacent power transmission elements 902 may share or use the first wall 904 and the second wall 906 for more than one cavity. In FIG. 9, the cross section is across a horizontal plane that divides the power transmission elements 902 into an upper portion and a lower portion. The upper portion is not shown and the lower portion that includes the antenna is shown.

In this embodiment, each cavity may have an E-coupled antenna 124 that may provide electromagnetic energy for its respective cavity. In this instance, the antenna 124 may be connected to the bottom of the cavity and pointing towards the upper portion (not shown) of the cavity. In other embodiments, the antenna may be of a H-coupled configuration, such that the antenna is pointed towards the opening 908 from a position along the rear of the cavity. FIG. 9 is not intended to limit the antenna design or the cavity design. In other embodiments, the size and number of cavities may vary, such that the first wall 904 and the second wall 906 may be thicker and create a longer distance between each of the openings 118 of the power transmission elements 114. The openings 908 may be designed in a similar manner as the openings described in the description of the previous figures. The dielectric component 122 may also be used to cover the openings 908 and prevent fluid communication between the plasma processing area and the cavities of the power transmission elements 902. Similarly, the angle of the first wall 904 and the second wall 906 may vary depending on the number of cavities and the diameter of the plasma chamber 902. The angles may vary between 60 degrees and 120 degrees.

Figure 10:
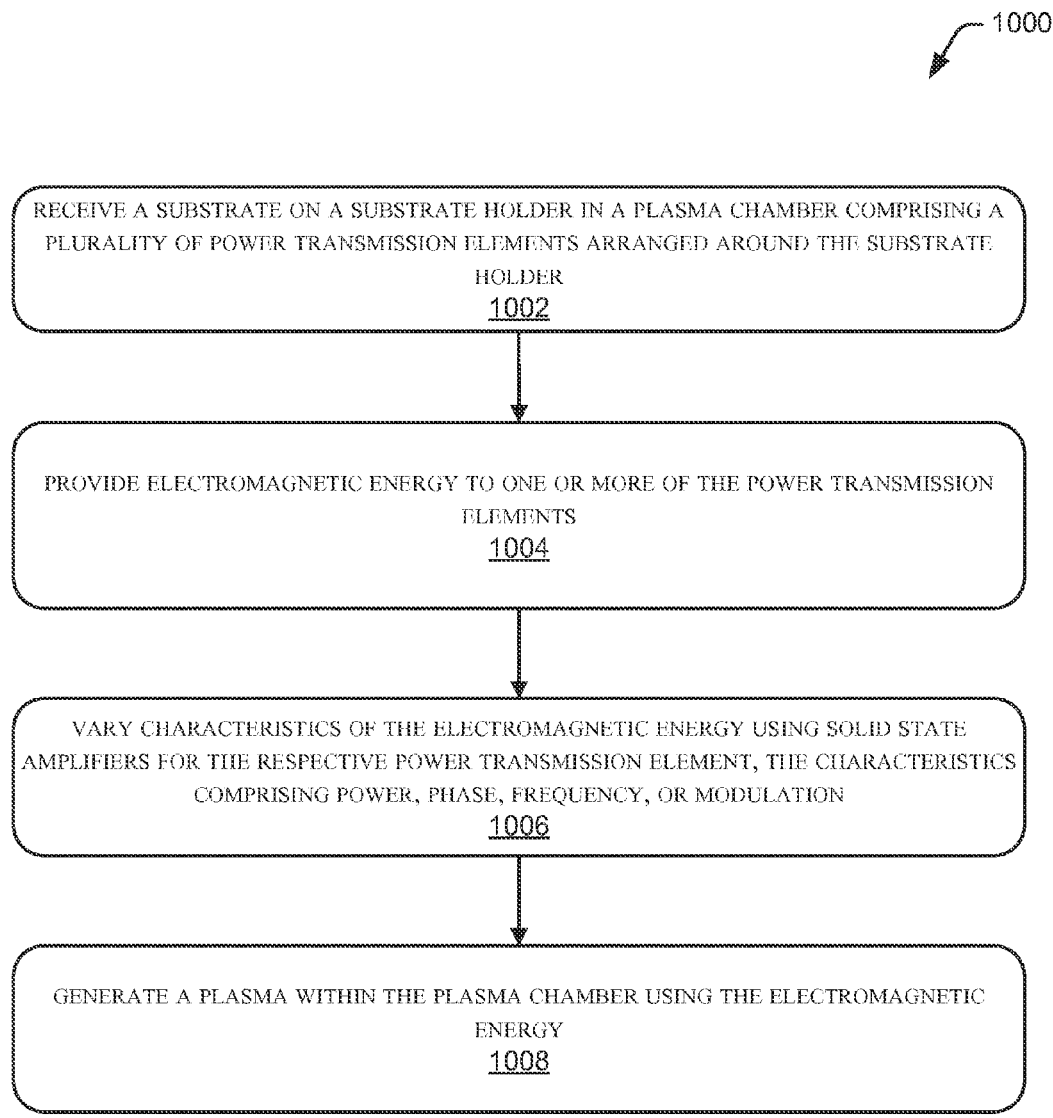
FIG. 10 includes a flow diagram for a method of operating the plurality of power transmission elements arranged around the plasma chamber.

FIG. 10 includes a flow diagram for a method 1000 of operating the plurality of power transmission elements 114 arranged around the plasma chamber 102. In one embodiment, the power transmission elements 114 may be coupled to a solid state amplifier that may be used to condition, tune, or adjust characteristics of the electromagnetic energy transmitted into the plasma chamber 102. The solid state amplifier uses solid state devices to control the characteristics of the electromagnetic energy. The solid state devices are typically formed using solid materials (e.g., silicon substrate) or films to control electron flow through the materials or films to achieve a desired result or signal. This may be in contrast to using non-solid state devices, such as vacuum tubes. Generally, the solid state devices improve stability and control over the signals and have lower cost than non-solid state devices.

At block 1002, the plasma chamber 102 may receive a substrate to process using a plasma treatment. The plasma chamber 102 may include a substrate holder that may secure the substrate for treatment using electrical or mechanical techniques know to those skilled in the art of plasma processing. The plasma chamber 102 may include power transmission elements 114 arranged around or above the substrate. FIG. 1 illustrates one embodiment of the power transmission element arrangement.

At block 1004, the plasma power source 106 may provide electromagnetic energy to one or more of the antennas 124 within each of the power transmission elements 114. As described above in the description of FIGS. 1-7, a standing wave may form in the interior cavity 120 and energy may propagate through the opening 118 and the dielectric component 122 into the plasma chamber 102.

At block 1006, the solid state amplifier may vary the characteristics of the electromagnetic energy, such that the power, phase, frequency, and/or modulation may be varied to achieve a desired plasma density and/or uniformity within the plasma chamber.

The power may be varied between 50 W and 3500 W within a frequency between 0.9 GHz up to at least 11 GHz. In one specific embodiment, the frequency may be tuned to about 2.5 GHz and may be tuned to match the impedance between the plasma power source 106 and the plasma chamber 102, or the along the path described in the description of FIG. 6. During the tuning, the frequency of the electromagnetic energy may vary up 3% of the center frequency of 2.5 GHz. For example, the frequency may vary to obtain the peak power to the plasma chamber 102. In one specific embodiment, the frequency may vary between 2.4 GHz and 2.6 GHz.

One or more frequencies may be applied to the plasma chamber 102 by applying different frequencies to one or more of the power transmission elements 114. For example, one group of power transmission elements 114 may receive a first frequency and a second group of power transmission elements may receive a second frequency.

In other embodiments, the electromagnetic energy signal may be modulated or pulsed with a duty cycle between 10% and 90%.

At block 1008, the plasma chamber 102 may be also receive one or more reactive chemicals (e.g., HBr) using the gas delivery system 104 and maintain a process pressure of at least sub-atmospheric pressure using the vacuum system 108. As described in the description of FIG. 1, the introduction of electromagnetic energy into the plasma chamber 102 may ionize the reactive gases and form plasma that may be used to treat the substrate.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A plasma processing system for processing semiconductor substrates, comprising:
    a plasma chamber comprising a plasma processing area and a substrate holder disposed in the plasma processing area;
    a plurality of power transmission elements arranged circumferentially around a periphery of the plasma chamber, each power transmission element comprising:
        an interior cavity to propagate microwave frequency electromagnetic waves; and
        an opening between the interior cavity and the plasma chamber, with the opening being an exit for the interior cavity on a plasma chamber side of the interior cavity;
    an antenna coupled to each power transmission element, wherein each antenna extends into a respective interior cavity and is disposed away from a respective opening at a predetermined distance; and
    a dielectric component that limits fluid communication between the interior cavity and the plasma chamber, wherein the predetermined distance from the opening is at least about ¼ wavelength of the microwave frequency electromagnetic waves, wherein each antenna extends through a top wall of a respective power transmission element such that the antenna is perpendicular to the top wall;

wherein the antennas are disposed above the plasma processing area and arranged around the plasma chamber;

wherein each opening has a dimension in a first direction of at least about ¼ wavelength of the microwave frequency electromagnetic waves and a dimension in a second direction orthogonal to the first direction of from 0.5 mm to 10 mm; and wherein the dielectric component has an arcuate shape that is installed within the plasma chamber and extends to cover a plurality of said openings that are disposed circumferentially and associated with plural interior cavities respectively of the plurality of power transmission elements, such that the microwave frequency electromagnetic waves pass from the plural interior cavities through their respective openings and then through the dielectric component into the plasma chamber.

2. The plasma processing system of claim 1, wherein the interior cavities of the power transmission elements are not in fluid communication with each other.

3. The plasma processing system of claim 1, wherein the power transmission elements are arranged in a circular manner around the substrate holder.

4. The plasma processing system of claim 1, wherein each antenna is disposed opposite of or parallel to a respective dielectric component.

5. The plasma processing system of claim 1, further comprising a solid state amplifier that can vary one or more of the following characteristics of the electromagnetic waves: power, phase, frequency, or modulation.

6. The plasma processing system of claim 1, wherein the at least two of the power transmission elements comprise a common wall that electrically isolates the at least two power transmission elements from each other.

7. The plasma processing system of claim 1, wherein the power transmission elements comprise:
  a first power transmission element comprising a first interior cavity; and
  a second power transmission element comprising a second interior cavity that has a geometry or volume that is different from the first interior cavity.

8. The apparatus of claim 7, further comprising a solid state amplifier for the respective power transmission elements to control the phase, power, frequency, and modulation of the electromagnetic energy to the power transmission elements.

9. The plasma processing system according to claim 1, wherein at least one interior cavity of the plurality of power transmission elements has a rounded perimeter and wherein the opening is an opening through the rounded perimeter.

10. The plasma processing system according to claim 9, wherein the antenna of the at least one cavity having the rounded perimeter extends in a direction parallel to a curvature axis of the rounded perimeter.

11. The plasma processing system of claim 1, wherein the plasma chamber is cylindrical, the substrate holder is configured to support a semiconductor substrate, and a direction from (a) the antenna toward (b) the opening is a radially inward direction.

12. An apparatus, comprising:
  a plasma processing chamber comprising:
    plasma processing area;
    a substrate holder disposed in the plasma processing area and can receive a substrate; and
    a chamber wall comprising a plurality of openings arranged circumferentially around the substrate holder;
  one or more dielectric components installed within the plasma processing chamber that cover the openings;
  a plurality of power transmission elements that are disposed adjacent to the openings and opposite the one or more dielectric components, the plurality of power transmission elements extending from a periphery of the plasma processing chamber and comprising a waveguide cavity with at least one respective opening of the plurality of openings being an exit for the waveguide cavity on a plasma processing area side of the waveguide cavity that can transmit electromagnetic energy towards the respective opening;
  one or more antennas coupled to each of the power transmission elements, wherein each antenna extends into a respective waveguide cavity and is disposed away from a respective opening at a predetermined distance; and
  a power source component that provides the electromagnetic energy within a range of 300 kHz to 300 GHz to the plurality of power transmission elements,
  wherein the predetermined distance from the opening is at least about ¼ wavelength of the electromagnetic energy,
  wherein each antenna extends through a top wall of a respective power transmission element such that the antenna is perpendicular to the top wall; and
  wherein the antennas are disposed above the plasma processing area and arranged around the chamber wall of the plasma chamber;
  wherein each opening has a dimension in a first direction of at least about ¼ wavelength of the electromagnetic energy, and the opening has a dimension in a second direction orthogonal to the first direction of from 0.5 mm to 10 mm; and
  wherein the one or more dielectric components include an arcuate dielectric component that has an arcuate shape and that extends to cover a plurality of said openings associated with plural waveguide cavities of the plurality of power transmission elements, such that the electromagnetic energy passes from the waveguide cavities through their respective openings and then through the arcuate dielectric component into the plasma processing area.

13. The apparatus of claim 12, wherein the openings are disposed horizontally in the chamber wall around the substrate holder.

14. The apparatus of claim 12, wherein the openings are disposed vertically in the chamber wall around the substrate holder.

15. The apparatus of claim 12, wherein at least one of the power transmission elements comprise:
  a first waveguide cavity having a length or a width of at least ¼ wavelength of the electromagnetic energy, and
  a second waveguide cavity having a length or width of at least wavelength of the electromagnetic energy.

16. The apparatus of claim 15, wherein the power source component provides a first frequency bandwidth of electromagnetic energy to a first power transmission element and a second frequency bandwidth of electromagnetic energy to a second power transmission element.

17. The apparatus of claim 12, wherein the openings form a continuous opening around the plasma processing chamber.

18. The apparatus of claim 12, wherein the power transmission elements comprise a first group with a first interior cavity design and a second group with a second interior cavity design, wherein the first interior cavity design has a first volume that is different from a second volume of the second interior cavity design.

19. The plasma processing apparatus of claim 12, wherein at least one waveguide cavity has a rounded perimeter and wherein the opening is an opening through the rounded perimeter.

20. The plasma processor apparatus according to claim 19, wherein the antenna of the at least one waveguide cavity that has a rounded perimeter extends in a direction parallel to an axis of curvature of the rounded perimeter.

21. The plasma processing apparatus of claim 12, wherein the plasma processing chamber is cylindrical, the substrate holder is configured to hold a semiconductor substrate, and a direction from (a) the antenna toward (b) the opening is a radially inward direction.

* * * * *